United States Patent [19]

Modisette et al.

[11] Patent Number: 4,820,929

[45] Date of Patent: Apr. 11, 1989

[54] DYNAMIC INFRARED SIMULATION CELL

[75] Inventors: J. Everett Modisette, San Antonio, Tex.; R. Barry Johnson, Huntsville, Ala.

[73] Assignee: Texas Medical Instruments, Inc., Schertz, Tex.

[21] Appl. No.: 37,223

[22] Filed: Apr. 10, 1987

[51] Int. Cl.$^4$ .......................... G21G 4/00; G01J 1/00
[52] U.S. Cl. ............................ 250/504 R; 250/493.1
[58] Field of Search .......... 250/504 R, 495.1, 370 L, 250/211 R, 493.1; 313/501, 524

[56] References Cited

U.S. PATENT DOCUMENTS

| 2,747,104 | 2/1956 | Jacobs | 378/97 |
| 2,883,556 | 4/1959 | Jenny et al. | 250/213 R |
| 2,985,757 | 5/1961 | Jacobs et al. | 250/351 |
| 3,102,201 | 8/1963 | Braunstein et al. | 250/504 R |
| 3,735,137 | 5/1973 | Bly | 250/504 R |
| 4,572,958 | 2/1986 | Durand et al. | 250/504 R |

Primary Examiner—Bruce C. Anderson
Attorney, Agent, or Firm—John S. Egbert

[57] ABSTRACT

A dynamic infrared simulation cell comprising a photoconductive layer, a first conductive layer, a second conductive layer, and an external energy source. The first conductive layer is affixed about one side of the photoconductive layer and is transmissive with respect to radiation of known energy. The second conductive layer is affixed about the other side of the photoconductive layer. The external energy source connects to the first conductive layer and the second conductive layer. The photoconductive layer is a plurality of segments of photoconductive silicon material. A dielectric material fills the areas between the segments of photoconductive material. The first conductive layer is a transparent layer of gold material. The second conductive layer is a layer of aluminum material. An enclosure is available for maintaining the cell in a darkened environment.

28 Claims, 3 Drawing Sheets

DYNAMIC INFRARED SIMULATION CELL

TECHNICAL FIELD

The present invention relates to devices for transforming visible images into infrared images. More particularly, the present invention relates to devices for the production of infrared images through the use of a layered structure having a photoconductive layer.

BACKGROUND ART

Infrared light is that portion of the electromagnetic spectrum adjacent to the long wavelength, or red end of the visible light range. Invisible to the eye, it can be detected as a sensation of warmth on the skin. The infrared range is usually divided into three regions: near infrared (nearest the visible spectrum), with wavelengths 0.78 to 3.0 microns; middle infrared, with wavelengths 3 to 30 microns; and far infrared, with wavelengths 30 to 300 microns. Most of the radiation emitted by a moderately heated surface is infrared light; it forms a continuous spectrum. Molecular excitation also produces copious infrared radiation but in a discreet spectrum of lines or bands.

In application, infrared sensors on the ground, or in aircraft or spacecraft, can detect such hot spots as motor-vehicle engines, hot jet engines, missile exhaust, and even campfires. They generally have good location accuracy and high sensitivity to signals, without registering such false targets as sun reflections. Infrared imaging detectors are also used. In the very near infrared region, specially sensitized photographic film forms camouflaged-revealing images. More important are the detectors used in the far infrared region; objects at room temperature radiate sufficient energy for detection at ranges of several miles. Infrared imagery can have longer range than image intensifiers and can operate without starlight.

While the prior art has shown a vast assortment of devices that can detect infrared radiation, there is little known in the prior art for the conversion of visible light into infrared radiation. Typically, in military exercises, objects must be individually heated in order to produce infrared radiation. Another apparatus used is the Bly Cell. The Bly Cell projects an image onto a polymer sheet at great intensity such that the light itself serves to heat the sheet. An image is produced since the most intense portions of the light will elevate the temperature of the polymer sheet a greater amount than the less intensely illuminated portions of the projected image. The Bly Cell, however, requires a large amount of power for image generation. In addition, the spatial and temporal resolution of the image is poor.

It is an object of the present invention to provide a dynamic infrared simulation cell which is capable of converting a light image into an infrared image.

It is another object of the present invention to provide an infrared simulation cell that operates with low amounts of power and energy consumption.

It is another object of the present invention to provide an infrared simulation cell that offers a high level of spatial and temporal resolution.

It is still another object of the present invention to provide an infrared simulation cell that is capable of operating at realtime speeds for the projection of "moving" infrared pictures.

These and other objects and advantages of the present invention will become apparent from a reading of the attached Specification and appended claims.

DISCLOSURE OF THE INVENTION

The present invention is an infrared simulation device comprising: a photoconductive layer, a first conductiive layer affixed to the photoconductive layer, a second conductive layer affixed to the other side of the photoconductive layer, and an external energy source connecting to the first conductive layer and the second conductive layer. The photoconductive layer is a layer of silicon material. This layer of silicon material is made up of a plurality of separate segments. These segments of the photoconductive material generally act as the pixels of the projected infrared images. The photoconductive layer further includes insulative material affixed between the segments of photoconductive material.

The first conductive layer is a transparent layer of gold material. This first conductive layer includes a conductive band extending about the outer edges of the conductive layer. This band serves to transmit energy from the external energy source to the first conductive layer.

The second conductive layer serves to remove heat from the photoconductive layer. This cooling effect may be accomplished by making the second conductive layer of a material having strong heat sink properties. For example, this may be a layer of aluminum. Alternatively, the cooling may be a cooling fluid communicating with and circulating within the interior of this conductive layer.

The present invention also includes an enclosure for maintaining the layered structure in a generally darkened environment. A source of imaging radiation is directed toward the first conductive layer within the enclosure. This source of imaging radiation may be either a two-dimensional light image directed onto the photoconductive layer or it may have a modulated light beam directed in a raster scanning pattern onto the layered structure. The enclosure includes suitable optics for the transmission of imaging radiation into the enclosure and for the emission of infrared radiation from the enclosure.

BEST MODE FOR CARRYING OUT THE INVENTION

Figure 1:
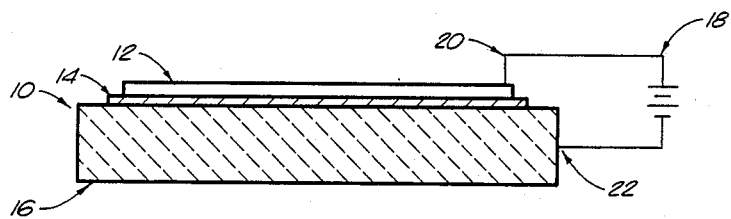
FIG. 1 is a cross-sectional view of a simplified embodiment of the infrared simulation cell of the present invention.

Referring to FIG. 1, there is shown a dynamic infrared simulation cell 10 in accordance with the present invention. Simulation cell 10 has a first conductive layer 12, a photoconductive layer 14, a second conductive layer 16, and an energy source 18. These elements combine to form a simplified embodiment of the present invention in which a light image of a scene is converted into an infrared image.

First conductive layer 12 is ideally a thin film of transparent gold. This first conductive layer 12 may also be Nesa glass, or a plastic film with a conductive coating, i.e., gold-covered Mylar. While in the preferred embodiment of the present invention, conductive layer 12 should be transparent, it is also possible to configure layer 12 in certain other ways such that layer 12 will be transmissive only with regard to certain known energies. In other words, layer 12 may be configured so as to block out certain forms of light while permitting other forms of light to pass therethrough. A lead 20 of energy source 18 is electrically connected to first conductive layer 12.

Photoconductive layer 14 is a layer of silicon material integrally affixed between first conductive layer 12 and second conductive layer 16. The thickness of the silicon layer 14 must be selected to maximize the efficiency of the cell 10. Basically, the thicker the silicon, the more it interacts with a given energy of exposing radiation and the more electron-hole pair a given quantity of radiation produces. Conversely, as the silicon layer is made thinner the electric field acting on these electron-hole pairs becomes stronger (the same potential over less distance). The optimum thickness of this photoconductive layer 14 will depend on the characteristics of the photoconductor and the energy level of the imaging radiation it is designed to sense.

It must be noted here that although silicon would be the preferable photoconductive material, it is also possible to utilize other materials as the photoconductor of the present invention. Selenium or cadmium sulfide are two types of photoconductive material that could be used instead of silicon. The particular type of photoconductive material will depend on the characteristics of the light being sensed, on manufacturing capabilities, and a wide variety of other factors.

Second conductive layer 16 is a comparatively large layer of a material having good heat sink properties. The purpose of second conductive layer 16 is to remove the heat as fast as possible from photoconductive layer 14. This may be accomplished by using copper or aluminum as the material for the layer. Alternatively, and described hereinafter, this may also be accomplished with other materials and incorporating a cooling system therein. However, for the purpose of this simplified embodiment, an aluminum layer 16 will suffice. Lead 22 of energy source 18 is electrically connected to second conductive layer 16.

Energy source 18 is generally any source of direct current. Energy source 18 serves to impress voltage through this layered structure of cell 10. While direct current is shown in conjunction with the simplified embodiment of the present invention, it is also possible to use alternating current in combination with the layered arrangement of FIG. 3, to be described hereinafter.

Figure 2:
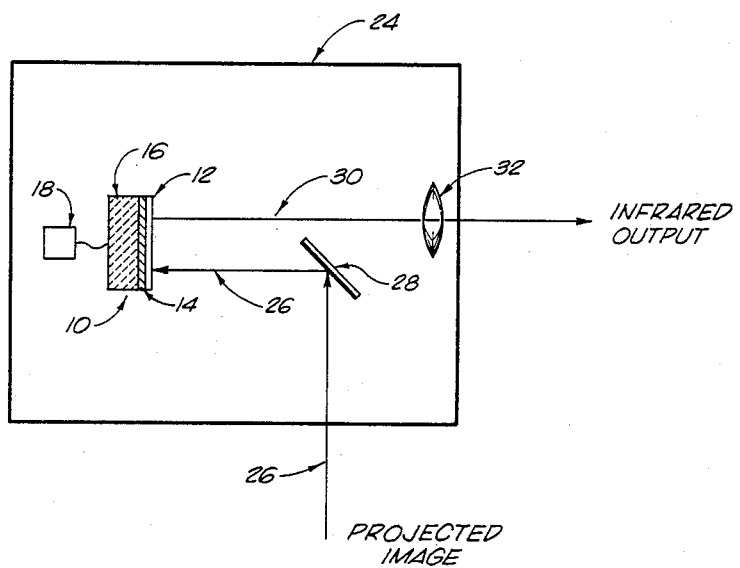
FIG. 2 is a schematical representation of the operation of the present invention.

FIG. 2 is a schematical illustration of the operation of this simplified embodiment of the present invention.

Initially, the simulation cell 10 is placed in darkened enclosure 24. A projected image 26 is directed onto the first conductive layer 12 of cell 10 by partially silvered mirror 28. Typically, the light of the projected image 26 should be blue light in order for the silicon of the photoconductive layer 14 to act as a photoconductor. Of course, other forms of light could be used in association with other types of photoconductive material. The projected image 26 passes through transparent conductive layer 12 onto photoconductive layer 14. This light then spatially modulates the resistance of the photoconductive layer 14. While this is occurring, the constant potential of energy source 18 is impressed across first conductive layer 12 and second conductive layer 16. As the resistance of photoconductive layer 14 spatially changes in response to the projected light image 26, current flows through that portion of photoconductive layer 14 in response to the local resistance of the photoconductive layer. In essence, photoconductive layer 14 acts as a variable resistor. The passing of an electrical current through an area of high resistivity produces greater heat in that area of the photoconductive layer than an area exhibiting less resistivity. Typically, photoconductors become more conductive and less resistive in the presence of light. The degree of conductivity is a function of the intensity of light. The present invention produces an infrared image by generating heat in these areas of the photoconductive layer that correspond inversely to the intensity of light acting on such areas. In other words, a "heat" image is generated which corresponds to the image directed to the photoconductive layer. The interaction of electrical current and light results in power being expended in the local area of photoconductive layer corresponding to the image projected onto that local area. The heat thus generated emits an infrared flux 30 that can be viewed by appropriate thermal imaging systems. If the light image 26 is spatially and temporally modulated, then the dynamic infrared simulation cell 10 will present an infrared representation of the scene of projected image 26 on the surface of photoconductive layer 14. This image projects through first conductive layer 12 and outward through optics 32 as an infrared representation of the projected image.

White the simplified embodiment of FIGS. 1 and 2 would work, some problems could be encountered due to thermal diffusion within photoconductive layer 14. Such thermal diffusion would weaken spatial resolution since the image would appear smeared. In addition, temporal resolution would be worsened since the heat in the photoconductive layer would diffuse throughout the photoconductive layer instead of into the heat sink/second conductive layer 16. However, the present invention could be modified so as to provide good spatial and temporal resolution. A modification for resolution enhancement of the simplified embodiment, shown in FIGS. 1 and 2, is illustrated in FIGS. 5 and 6.

Figure 5:
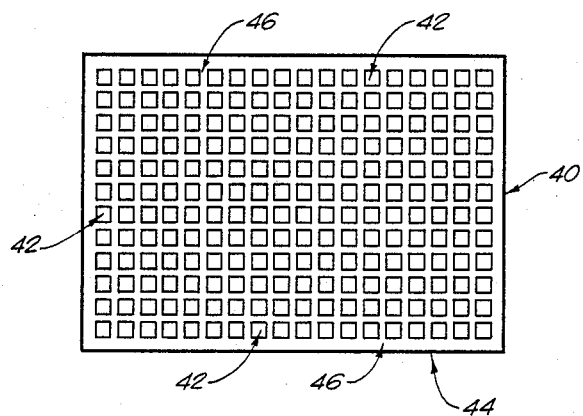
FIG. 5 is a top view of the photoconductive layer, specifically showing the segments of photoconductive material about the surface of the second conductive layer.
Figure 6:
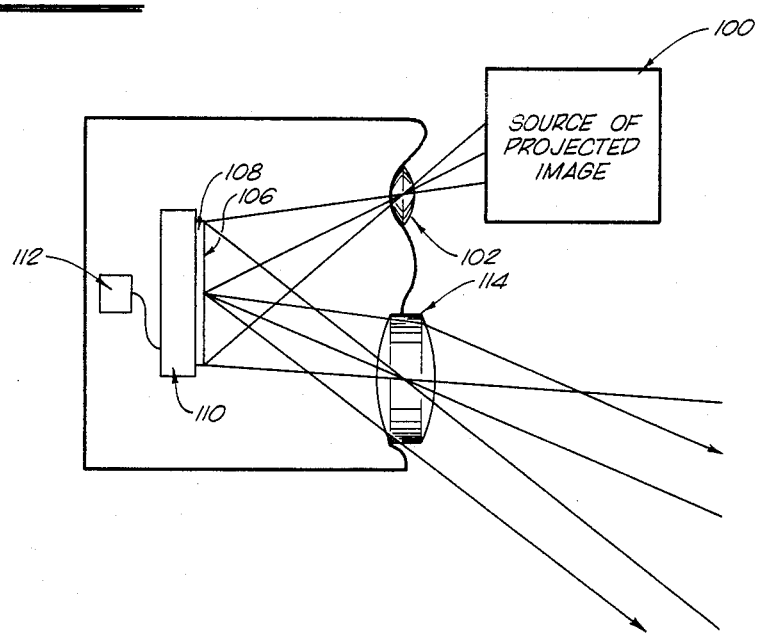
FIG. 6 is a schematical representation of the operation of the infrared simulation cell in accordance with the teachings of the present invention.

As can be seen in FIG. 5, the photoconductive layer 40 is divided into a plurality of segments 42 of photoconductive material. Essentially, the photoconductive layer 40 is cross-hatched with cuts such that "islands" of silicon (or other photoconductive material) are formed. Each segment 42 is distinct and separate from other segments 42. Essentially, these segments 42 of photoconductive material are arranged so as to act as the pixels of a typical projected image. The segments 42 may be created by chemical etching or ion-beam etching. The segments 42 are suitably deposited onto second conductive layer 44.

A dielectric material 46 having low thermal conductivity is deposited between the segments 42 of photoconductive material. In essence, the dielectric material 46 serves to isolate each of the segments 42 of photoconductive material from other segments of photoconductive material. As seen in FIG. 6, the top of the layer having the photoconductive material 42 and the dielectric material 46 is "milled" such that the surfaces of the materials are reasonably coplanar. First conductive layer 48 is then deposited onto this layer. As before, first conductive layer 48 is optically transparent to light. Leads 50 and 52 connect the first conductive layer 48 and the second conductive layer 44 to energy source 54.

Figure 4:
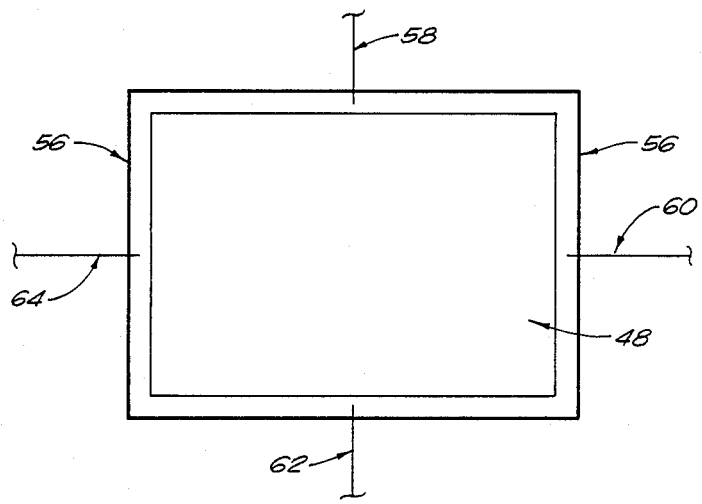
FIG. 4 is a top view of the conductive band about the first conductive layer of the present invention.

As seen in FIG. 4, first conductive layer 48 has a conductive band 56 extending about its outer edges. Conductive band 56 has leads 58, 60, 62, and 64 electrically connected to its sides. The reason for this conductive band is to avoid "hot spots" about the photoconductive layer as the current is carried through the layered structure. By delivering the current to the layered arrangement from all four sides, the current more evenly distributes about the photoconductive layer 40, thereby avoiding spatial distortion in the produced infrared image.

The operation of this embodiment of the invention is similar to that of the simplified embodiment. As stated previously, the projected image is directed onto the photoconductive layer 40 through first conductive layer 48. Since photoconductive layer 40 is made up of segments 42 of photoconductive material, the image is imparted onto discrete pixels (in the form of the segments 42). Each of the segments 42 is a part of the resistance pattern in the silicon layer. Similarly, each of the segments/pixels 42 contains a portion of the overall heat image produced. The combination of the image contained on each pixel found in photoconductive layer 40 emits an infrared flux that can be viewed by a thermal imaging system. As opposed to the simplified embodiment stated previously, this embodiment delivers the infrared image without the loss of spatial and temporal resolution caused by thermal diffusion throughout the photoconductive layer. The dielectric material 46 prevents thermal diffusion between the segments 42 in the photoconductive layer. Thus, there is no "smearing" of the projected infrared image. Additionally, the dielectric material 46 contains the heat image to the individual segment of photoconductive material. This means that the heat sink/second conductive layer 44 rapidly removes the heat from each of the pixels. This causes this embodiment of the invention to have a high level of temporal resolution.

Figure 3:
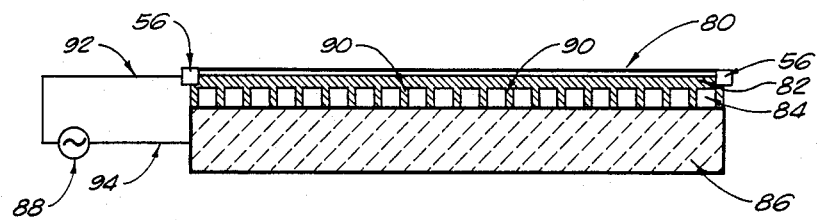
FIG. 3 is a cross-sectional view of an alternative embodiment of the present invention incorporating a layer of insulative material between the first conductive layer and the photoconductive layer.

Another embodiment of the present invention is shown in FIG. 3. This embodiment is particularly adapted to the use of alternating current as the energy source. Specifically, this embodiment comprises a first conductive layer 80, a dielectric layer 82, a segmented photoconductive layer 84, a second conductive layer 86, and an alternating current energy source 88. In this embodiment, the segmented structure of photoconductive layer 84 is similar to that as appears in FIG. 5. Specifically, photoconductive layer 84 is made up of a multiplicity of individual pixels of photoconductive material. These pixels of photoconductive material are deposited upon second conductive layer 86. As with the previous embodiment, dielectric material, similar to that found in layer 82, is used to fill in the areas between the individual pixels of photoconductive layer 84. This material serves to isolate the individual pixels, as described previously.

Dielectric layer 82 is deposited over the segmented photoconductive layer 84. This dielectric layer has high resistivity and high thermal resistance. This dielectric layer 82 is integrally affixed to the layer formed by segmented photoconductive layer 84 and the filler dielectric material 90. The dielectric layer 82 physically supports first conductive layer 80. Dielectric layer 82 should also be generally transparent so as to transmit imaging radiation to the photoconductive layer 84. First conductive layer 80 is integrally affixed to the top of dielectric layer 82. Leads 92 and 94 are electrically connected to first conductive layer 80 and second conductive layer 86, respectively. Leads 92 and 94 connect the layered structure of this embodiment with alternating current energy source 88. This embodiment must be operated as an AC unit since a capacitor has been formed by the use of the dielectric layer 82 between the energy source and the photoconductive layer. The operation of this embodiment of the invention will be similar to that as described before, except for the fact that an alternating current energy source is used in place of the direct energy source.

In this alternative embodiment of the invention, the conductive band, as illustrated in FIG. 4, may be arranged about the edges of the first conductive layer 80. This should enhance the operation of the infrared simulation cell by distributing the energy evenly across the photoconductive layer.

FIG. 6 is a representation of the operation of the present invention. In FIG. 6, the source of a projected image 100 directs the image through lens 102. The source of projected image 100 may be either a typical film and light projector unit or it may be a cathode ray tube or laser projection unit. In this invention, the image may be projected onto the infrared simulation cell by either the projection of a light image over the field of the photoconductive layer of the cell or it may be a modulated light beam directed to the photoconductive layer of the cell in a raster scanning pattern. The infrared simulation cell will function properly with either of these sources of projected image.

The light image passes through lens 102 into the darkened enclosure 104. Lens 102 focuses the light image onto the surface of transparent conductive layer 106. The light image passes through transparent conductive layer 106 and interacts with photoconductive layer 108. Since photoconductive layer 108 is a layer of segments of photoconductive material, as represented in FIG. 5, the projected light image will be received by individual pixels of photoconductive material. The projected light image, in combination with the voltage impressed across conductive layers 106 and 110, spatially changes the current flowing through the photoconductive layer 108. The voltage is impressed across layers 106 and 110 by energy source 112. Once the projected light image is received by photoconductive layer 108, heat is generated on the individual photoconductive pixels in relation to the intensity of the projected image. Thus, an infrared flux is emitted by each pixel in photoconductive layer 108. The combination of the infrared flux from each pixel in photoconductive layer 108 produces an infrared image simulating the projected image.

The infrared image on photoconductive layer 108 is projected through infrared projector lens 114. The infrared flux passing through lens 114 is collimated. The image passing from the simulation cell may be received and viewed by thermal imaging systems. These thermal imaging systems are found in current military and industrial usage.

The present invention, in all of its embodiments, offers a number of advantages not found before in previous infrared simulation systems. First, temperature changes within each of the individual pixels of photoconductive material can be greater than 100° centigrade. Such a large temperature change potential provides great infrared resolution. Secondly, this simulation cell can be operated under realtime conditions. This imaging system may receive and convert film operating at 30 frames per second or more. The reason for the above two qualities is the fact that the individual pixels of photoconductive material are very small and thermally isolated from one other such that any rapid temperature changes will quickly diffuse into the heat sink or the dielectric material. Each pixel may have a temperature variation greater than 100° centigrade in combination with an image projected at more than 30 frames per second. Such technology is presently not available in simulation cells of the prior art.

Another advantage of the dynamic infrared simulation cell of the present invention is that it can operate with little energy or power expenditure. In the prior art, large amounts of power were required to produce a simulated infrared image. The present invention does not require much power since less mass needs to be heated. Preliminary calculations show that only four milliwatts of power is required to produce a 100° centigrade temperature change in an individual pixel of photoconductive material. Thus, only a few hundred watts of power would be required to operate a cell having a hundred thousand pixels of photoconductive material. These calculations assume a pixel size of 0.002 cm.×0.001 cm. It should be remembered, of course, that these estimates are only rough calculations. Less power would be required if the individual photoconductive pixels are of smaller size or if the total number of pixels used is less.

Still another advantage of the present invention is that an infrared image will be produced by the simulation cell even though the light directed onto the cell is very, very low. The photoconductive material is highly interactive with the light levels of the projected image. If amplification of the projected image is needed such that a "comparatively" bright thermal image is needed in relation to the intensity of the projected image, then the voltage applied across the conductive layers of the cell can be changed to account for these low light levels. Thus, the present invention offers the advantages of being able to receive low levels of projected light and to adjust the intensity of the projected infrared image as desired.

The foregoing disclosure and description of the invention is illustrative and explanatory thereof and various changes in the details of the illustrated apparatus may be made within the scope of the appended claims without departing from the true spirit of the invention. The present should only be limited by the appended claims and their legal equivalents.

I claim:

1. A device for transforming visible images into infrared images comprising:
   a photoconductive layer;
   a first conductive layer integrally affixed to one side of said photoconductive layer, said first conductive layer being transmissive with respect to radiation of known energy, said photoconductive layer being responsive to said radiation of known energy;
   a second conductive layer integrally affixed to the other side of said photoconductive layer; and
   an external energy source connected to said first conductive layer and said second conductive layer, said external energy source for passing a current across said layers, said photoconductive layer having a modulated resistivity in relation to said radiation of known energy.

2. The device of claim 1, said photoconductive layer being a layer of silicon material.

3. The device of claim 1, said photoconductive layer comprising a plurality of segments of photoconductive material.

4. The device of claim 3, said segments of photoconductive material being generally uniformly distributed across said second conductive layer.

5. The device of claim 4, said segments of photoconductive material generally forming the pixels relative to a projected image.

6. The device of claim 3, said photoconductive layer further including insulative material interposed between said segments of photoconductive material.

7. The device of claim 6, said insulative material forming a layer between said first conductive layer and said photoconductive layer.

8. The device of claim 6, said insulative material being a dielectric having high resistivity and high thermal resistance.

9. The device of claim 1, said first conductive material being a transparent layer of gold material.

10. The device of claim 1, said first conductive layer further comprising a conductive band extending about the outer edges of said first conductive layer, said conductive band for transmitting energy from said external energy source to said first conductive layer.

11. The device of claim 1, said second conductive layer including cooling means interactive with said second conductive layer for the removal of heat from said photoconductive layer.

12. The device of claim 11, said cooling means being said second conductive layer comprised of a material having strong heat sink properties.

13. The device of claim 12, said second conductive layer being a layer of aluminum.

14. The device of claim 1, further comprising:
   enclosure means for maintaining said photoconductive layer, said first conductive layer and said second conductive layer in a darkened environment.

15. The device of claim 2, further comprising a source of imaging radiation directed toward said first conductive layer.

16. The device of claim 15, said source of imaging radiation being a light image directed across the field of said photoconductive layer.

17. The device of claim 15, said source of imaging radiation being a modulated light beam directed to said photoconductive layer in a raster scanning pattern.

18. A device for transforming visible images into infrared images comprising:
   a first conductive layer transmissive with respect to radiation of known energy;
   a dielectric layer affixed to one side of said first conductive layer;

a photoconductive layer having one side affixed to said dielectric layer, said photoconductive being responsive to said radiation;

a second conductive layer affixed to the other side of said photoconductive layer; and electrical energy means connected to said first conductive layer and said second conductive layer for impressing a voltage across said layers, said photoconductive layer having a modulated resistivity in relation to said radiation of known energy.

19. The device of claim 18, further comprising:

enclosure means for maintaining said layers in a darkened environment, said enclosure means including optics for the transmission of imaging radiation into said enclosure means and the emission of infrared radiation from said enclosure means.

20. The device of claim 18, said photoconductive layer comprising a plurality of segments of photoconductive material, said dielectric layer disposed between said segments.

21. The device of claim 18, said energy means comprising a source of alternating current.

22. The device of claim 18, said first conductive layer being a transparent gold layer, said photoconductive layer being composed of silicon material, and said second conductive layer being a layer of aluminum.

23. A device for transforming visible images into infrared images a first conductive layer transmissive with respect to radiation of known energy;

a second conductive layer;

a plurality of segments of photoconductive material integrally affixed between said first conductive layer and said second conductive layer, each of said segments being individually responsive to said radiation of known energy; and electrical energy means connected to said first conductive layer and said second conductive layer for passing a voltage thorough said segments of photoconductive material.

24. The device of claim 23, further comprising:

dielectric material disposed between segments of photoconductive material.

25. The device of claim 24, said dielectric material forming a layer between said first conductive layer and said plurality of segments of photoconductive material.

26. The device of claim 23, further comprising:

enclosure means for maintaining said layer in a darkened environment, said enclosure means including optics for the transmission of imaging radiation into said enclosure means and the emission of infrared radiation from said enclosure means.

27. The device of claim 23, further comprising a source of imaging radiation directed toward said first conductive layer.

28. The device of claim 23, said second conductive layer acting as a heat sink with respect to said photoconductive material.

* * * * *